United States Patent
Wang

(10) Patent No.: US 7,554,827 B2
(45) Date of Patent: *Jun. 30, 2009

(54) ELECTROMAGNETIC COUPLING GALVANIC ISOLATED SOLID STATE RELAY WITH OUTPUT FEEDBACK

(75) Inventor: Tom Wang, Taipei (TW)

(73) Assignee: Netio Technology Co., Ltd., Taipei (TW)

( * ) Notice: Subject to any disclaimer, the term of this patent is extended or adjusted under 35 U.S.C. 154(b) by 420 days.

This patent is subject to a terminal disclaimer.

(21) Appl. No.: 11/436,605

(22) Filed: May 19, 2006

(65) Prior Publication Data

US 2007/0268649 A1 Nov. 22, 2007

(51) Int. Cl.
*H02M 7/00* (2006.01)
*H02J 1/00* (2006.01)
*H02M 3/00* (2006.01)
*H02M 3/22* (2006.01)
*H02M 3/335* (2006.01)

(52) U.S. Cl. ............ 363/125; 363/15; 363/16; 363/21; 361/18

(58) Field of Classification Search .......... None
See application file for complete search history.

(56) References Cited

U.S. PATENT DOCUMENTS

2005/0243481 A1* 11/2005 Williams et al. .......... 361/18

2007/0046501 A1* 3/2007 Wang et al. .......... 341/14

* cited by examiner

*Primary Examiner*—Stephen W Jackson
*Assistant Examiner*—Dharti H Patel
(74) *Attorney, Agent, or Firm*—Birch, Stewart, Kolasch & Birch, LLP

(57) ABSTRACT

A solid state relay is provided herein, which utilizes an electromagnetic coupling device for galvanic isolation and providing feedback from the output side to the system side. The solid state relay contains a system-side driving circuit, an electromagnetic coupling device, and an output-side control circuit. The electromagnetic coupling device contains at least a system-side electromagnetic coupling element, a first output-side electromagnetic coupling element, and a second output-side electromagnetic coupling element. The system-side driving circuit is connected to the system-side electromagnetic coupling element, and takes the ON/OFF digital control signals from a digital system as input to turn on and off its driving to the system-side electromagnetic coupling element. The electromagnetic coupling device converts and transmits the electrical energy from the system side to the output side and thereby provides the working energy to the output control circuit connected to the first output-side electromagnetic coupling element. The second output-side electromagnetic coupling element forms a feedback circuit, through which the electrical status at the output side is fed back to the system side via the electromagnetic coupling device.

14 Claims, 5 Drawing Sheets

ELECTROMAGNETIC COUPLING GALVANIC ISOLATED SOLID STATE RELAY WITH OUTPUT FEEDBACK

BACKGROUND OF THE INVENTION

1. Field of the Invention

The present invention generally relates to solid state relays, and more particularly to a galvanic isolated solid state relay having output-side feedback.

2. The Prior Arts

A solid state relay (SSR) is a switch device made by solid state electronic components. SSRs utilize the on/off switching characteristics of semiconductor components such as triodes and triacs to open and close a circuit without mechanical contacts and without causing sparks. SSRs are therefore referred to as contactless relays. In contrast to the electro-mechanical relays (EMRs), SSRs do not rely on the physical actuation of mechanical parts and, therefore, have numerous advantages such as small form factor, fast response, high reliability, long operation life (e.g., a SSR can be turned on/off up to $10^8$~$10^9$ times, which is at least a hundred folds better than an EMR), low noise and surge interference, more robust to shocks and impacts, just to name a few. In addition, a SSR can be driven by a low-powered signal to control a very large AC current. A SSR therefore can be safely and reliably employed at the output interface of a digital system.

A conventional SSR 1, as shown in FIG. 1, has a pair of system-side terminals for connecting to a digital system and a pair of output-side terminals for connecting to the external system or load under control. The SSR 1 uses a photo coupler as a galvanic isolation device to separate the system side and the output side, but allow the digital control signal from the system side to be transmitted to the output side. Based on the ON/OFF digital control signals from the digital system, a driving circuit 12 at the system side drives a light emitting device (i.e., the light emitting diode 11) of the photo coupler 10 to emitted light signals (represented by the arrow heads). A light sensing device (i.e., the photo transistor 13) at the output side of the photo coupler 10 detects the light signals and produces electrical signals corresponding to the ON/OFF digital control signal to drive the control circuit 14, which in turn controls the external load or system (i.e., the load 16).

The galvanic isolation device is, as a matter of fact, a kind of energy conversion device. In addition to the foregoing photovoltaic devices (i.e., photo couplers), other possible means include thermoelectric devices which convert between thermal energy and electrical energy, piezoelectric devices which convert between pressure and electrical energy, and electromagnetic device which convert between magnetic energy and electrical energy. One of the most common galvanic electromagnetic conversion devices is the transformer.

The conventional SSR has a number of disadvantages. For example, the output side requires the configuration of another galvanic isolated power source 17, in addition to the power source 15 at the system side. Besides, the control circuit at the output side could only function either as a current source or as a current sink to the load, meaning a less flexible applicability for the conventional SSR.

The foregoing conventional SSRs have another major flaw which limits the control signal conversion in one direction from the system side to the output side only. Due to the galvanic isolation between the system side and the output side, the digital system cannot obtain the status of the output side, such as whether the external load or system under control responds correctly to the control signals. To achieve such a goal, a feedback circuit comprising another photo coupler, transformer, or similar galvanic isolation device is required, so that the electrical output status of the output side such as its voltage, current, frequency, and whether it is in a faulty condition like open-circuited, short-circuited, or overloaded, could be fed back to the system side for the digital system's monitoring. Further more, the digital system would also require the configuration of additional input ports for connecting to the feedback circuit. All of the above increase the cost and wiring difficulty of the SSR and the digital system.

SUMMARY OF THE INVENTION

Accordingly, the major objective of the present invention is to provide a galvanic isolated SSR for digital systems that employs a single galvanic isolation device to achieve simultaneously the isolation of the system side and the output side, the transmission of ON/OFF digital control signals from the system side to the output side, and the feedback of the output status from the output side.

Another objective of the present invention is to provide a galvanic isolated SSR which does not require the configuration of additional power source at the output side, and which could be configured to function as a current source or a current sink to the load easily.

To achieve the foregoing objectives, the SSR proposed by the present invention has an output feedback terminal, in addition to the pair of input terminals, at the system side. The SSR uses an electromagnetic coupling device as the galvanic isolation device. The electromagnetic coupling device is similar to a transformer with windings, which contains at least a system-side electromagnetic coupling element, and at least two output-side electromagnetic coupling elements. The magnetic flux of these electromagnetic coupling elements passes through each other. Through electromagnetic induction between the system-side and the output-side electromagnetic coupling elements, an electrical signal at the system side causes the production a corresponding electrical signal at the output side, and vice versa.

The galvanic isolated SSR of the present invention contains a system-side driving circuit, an electromagnetic coupling device separating the system side and the output side, and an output-side control circuit. The system-side driving circuit is connected to the system-side electromagnetic coupling element of the electromagnetic coupling device, and takes the ON/OFF control signals from the digital system as input to turn on and off its driving to the system-side electromagnetic coupling element. The electromagnetic coupling device converts and transmits the electrical energy from the system side to the output side and thereby provides the working energy to the output-side control circuit connected to a first output-side electromagnetic coupling element. A second output-side electromagnetic coupling element forms a feedback circuit, through which the electrical status of the output side is fed back to the system-side electromagnetic coupling element when the system-side driving circuit is not driving the system-side electromagnetic coupling element. The system-side driving circuit therefore could learn the output status by sampling the system-side electromagnetic coupling element during intervals when it is not driving the system-side electromagnetic coupling element.

The electromagnetic coupling device could contain additional output-side electromagnetic coupling element, and/or system-side electromagnetic coupling elements, so as to feedback other output-side signals to the system side. The SSR could adopt other types of galvanic isolation devices and is not limited to electromagnetic coupling device only. The SSR of the present invention could further contain an output-side protection circuit to guard against overload, short circuit, overvoltage, etc. The output-side protection circuit could also prevent interferences from electromagnetic noises.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

Figure 1:
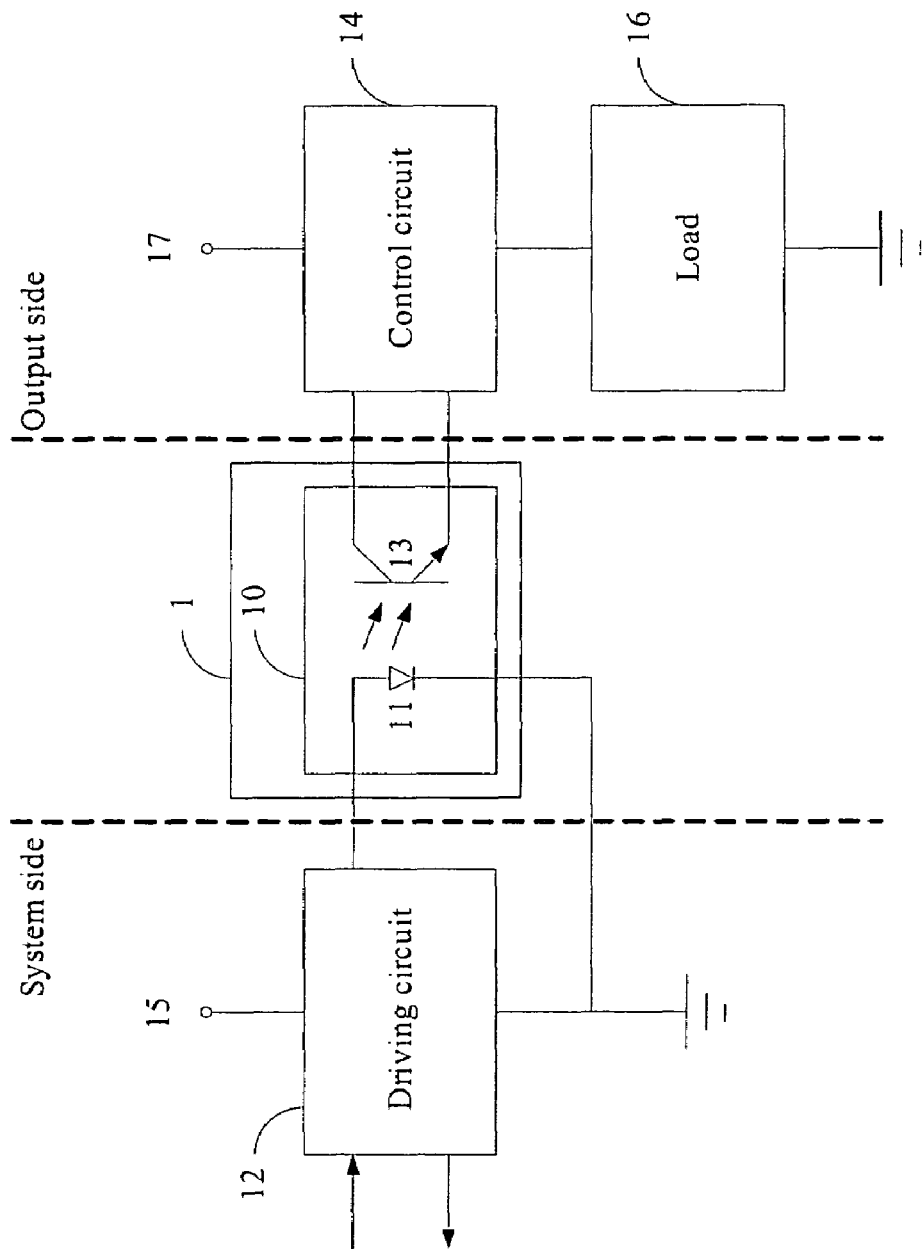
FIG. 1 is a schematic diagram showing a conventional SSR using a photo coupler as the isolation device.

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

One of the most significant characteristics of the present invention is the adoption of a bi-directional energy conversion device to separate the system side and the output side of a galvanic isolated SSR, converting energy from one form at the system side to another form at the output side, and vice versa. According to the present invention, the bi-directional energy conversion device contains at least a system-side electromagnetic coupling element, a first output-side electromagnetic coupling element, and a second output-side electromagnetic coupling element. The system-side electromagnetic coupling element converts and transmits electrical signals from the system side to the output-side electromagnetic coupling elements. The output-side electromagnetic coupling elements, on the other hand, also convert and transmit electrical signals from the output side to the system side. One typical example of this bi-directional energy conversion is by electromagnetic coupling, which is adopted by the present invention. Please note that the principles of the present invention disclosed below could be applied to similar bi-directional energy conversion devices other than those using electromagnetic coupling.

Please note that the implementation of an electromagnetic coupling device in a SSR can be achieved by laminated techniques using low-temperature ceramic cofire. These techniques have already been widely used to manufacture solid state passive components such as the laminated chip inductors for replacing conventional inductors with windings. As the subject matter of the present invention is not about the manufacturing method of the electromagnetic coupling device in a SSR and as the relevant techniques are already well known to people in the related arts, the implementation details of the electromagnetic coupling device are omitted here. In short, the electromagnetic coupling device is implemented by common integrated circuit manufacturing methods inside the SSR, and contains at least a system-side electromagnetic coupling element, a first output-side electromagnetic coupling element, and a second output-side electromagnetic coupling element. And, the magnetic flux of these electromagnetic coupling elements passes through each other so as to achieve bi-directional energy conversion. As the electromagnetic coupling device is similar to a transformer having windings. For example, the system-side electromagnetic coupling element is similar to the primary winding of the transformer and the output-side electromagnetic coupling elements are like to two secondary windings of the transformer. Therefore, in the accompanied drawings, the electromagnetic coupling device is presented like a transformer.

Figure 2A:
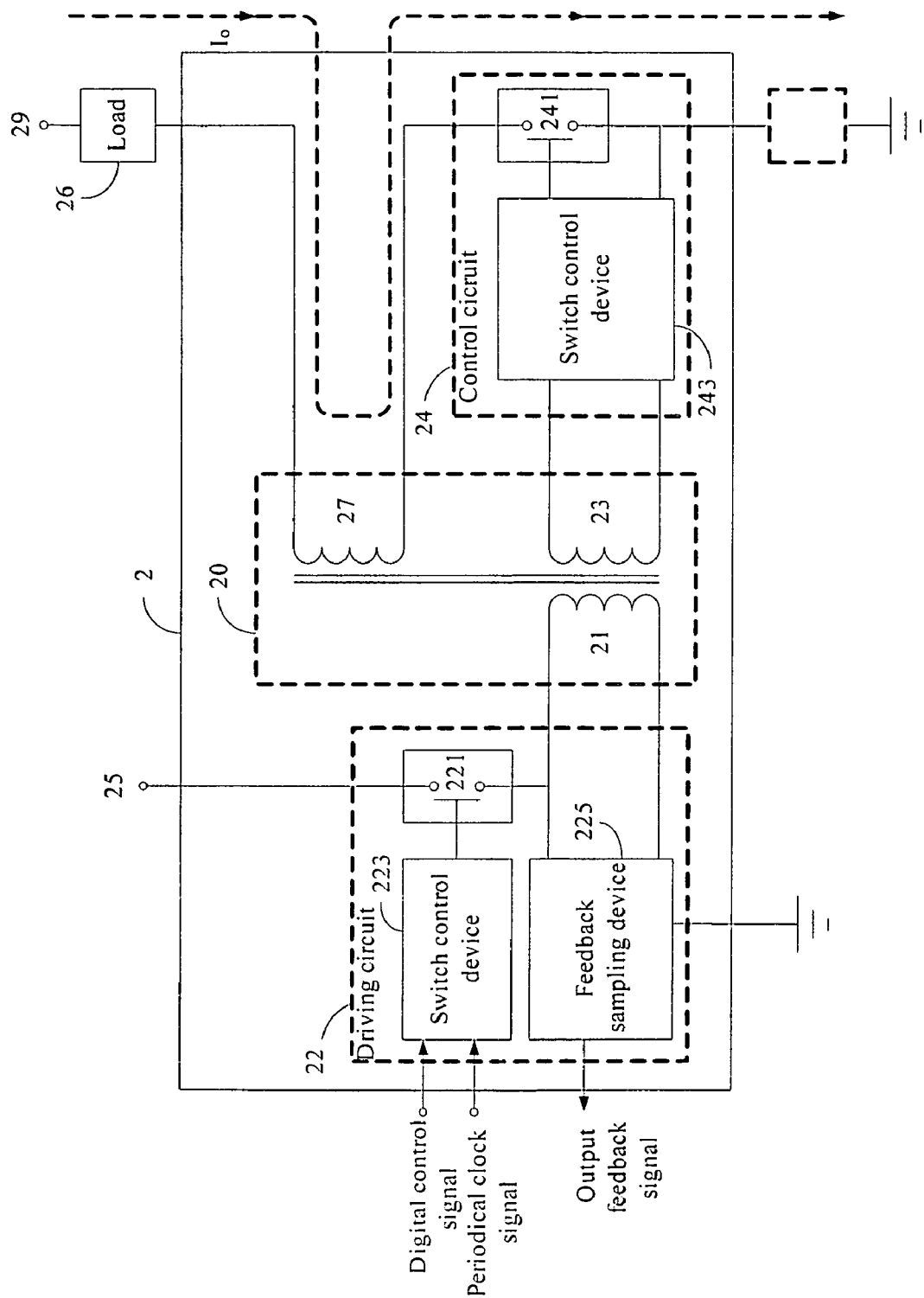
FIG. 2a is a schematic diagram showing a first embodiment of the present invention.

FIG. 2a is a schematic diagram showing a first embodiment of the present invention. As illustrated, the SSR 2 of the present embodiment contains at least an electromagnetic coupling device 20, a system-side driving circuit 22, and an output-side control circuit 24. The electromagnetic coupling device 20, which isolates the system side and output side, has at least a system-side electromagnetic coupling element 21 at the system side of the electromagnetic coupling device 20, and a first output-side electromagnetic coupling element 22 and a second output-side electromagnetic coupling element 27, both at the output side of the electromagnetic coupling device 20. Please note that, from the description below, the electromagnetic coupling device 20 can have more additional system-side and output-side electromagnetic coupling elements.

An end (hereinafter the first end) of the system-side electromagnetic coupling element 21 is connected to the system-side driving circuit 22, while the other end (hereinafter the second end) is connected to a negative end of an internal power source 25 of the digital system via an input terminal of the SSR 2 (shown in FIG. 2a as the ground), forming a circuit from the positive end of the internal power source 25, through the system-side driving circuit 22 and the system-side electromagnetic coupling element 21, to the negative end of the internal power source 25. Please note that the connection sequence between the positive and negative ends of the internal power source 25, the system-side driving circuit 22, and the system-side electromagnetic coupling element 21 is of no significance. In an alternative embodiment, for example, the second end of the system-side electromagnetic coupling element 21 is connected to system-side driving circuit 22 while the first end of the system-side electromagnetic coupling element 21 is connected the positive end of the internal power source 25. The principle lies in that the system-side driving circuit 22 and the system-side electromagnetic coupling element 21 are in a series connection between the positive and negative ends of the internal power source 25.

The system-side driving circuit 22 takes the ON/OFF digital control signal from the digital system via two input terminals of the SSR 2 (shown in FIG. 2a as the "digital control signal" and the ground) to turn on or off its driving to the system-side electromagnetic coupling element 21. The system-side driving circuit 22 mainly contains a switch device 221, a switch control device 223, and a feedback sampling device 225. The switch device 221 is an electronic switch having three terminals. In the present embodiment, its current output terminal is connected to the first end of the system-side electromagnetic coupling element 21, its current input terminal is connected the positive end of the internal power source 25, and its control terminal is connected to the output of the switch control device 223. As such, the switch device 221 is controlled to allow or disallow current flowing from the internal power source 25, through the current input terminal and the current output terminal of the switch device 221, to the system-side electromagnetic coupling element 21. Please note that, as mentioned earlier, there could be various connection sequences between the internal power source 25, the system-side driving circuit 22, and the system-side electromagnetic coupling element 21. Therefore, the connection of the switch device 221's terminals would vary accordingly. However, the principle is that the switch device 221 is always configured such that current flows through its input terminal and output terminal, and then into the system-side electromagnetic coupling element 21, or current flows into system-side electromagnetic coupling element 21, and then through its input terminal and output terminal.

The switch control device 223 has two types of input signals: one is the ON/OFF digital control signal from the digital system, and the other one is a periodical clock signal generated by an oscillator (not shown). When the digital control system is ON, the switch control device 223 allows the clock signal to apply on the control terminal of the switch device 221 so that the switch device 221 would short-circuit and open-circuit the conduction path between its current input and output terminals periodically. When the switch device 221 is short-circuited, current flows through the system-side electromagnetic coupling element 21 and energy is stored inside the system-side electromagnetic coupling element 21, which is equivalent to an inductor. When the switch device 221 is open-circuited, current will not flow through the system-side electromagnetic coupling element 21 and the stored energy is released to the output side. In an alternative embodiment, the oscillator could be an integral part of the SSR. Oscillators are quite common to people skilled in the related arts and their details are therefore omitted here.

The feedback sampling device 225 is in a parallel connection with the system-side electromagnetic coupling element 21, and, through an output terminal of the SSR 2 (shown in FIG. 2a as "output feedback signal"), the feedback sampling device 225 allow the digital system to sample the output-side status at appropriate times. More details will be given in the following.

At the output side of the present embodiment, the SSR 2 provides two output terminals to engage with the load 26 (which is the external system under the control of the SSR 2) in a series connection. A load circuit (represented by a dashed line) is formed from the positive end of an external power source 29 (assuming it is a DC source), through the load 26, the second output-side electromagnetic coupling element 27, and the output-side control circuit 24, to the negative end of the external power source 29 (represented by the ground symbol). Please note that the second output-side electromagnetic coupling element 27 therefore forms a feedback circuit allowing the load current $I_O$ to flow through. More details will be given in the following. Please also note that the load 26 could also be located at the location denoted by the dashed box so that the output side of the present embodiment functions as a current source to the load 26 (instead of a current sink as described above). Also, depending on the polarity configuration of the external power source 29, the load current $I_O$ could also flow in a reversed direction. In some embodiments, the load current $I_O$ can also be an alternating current.

The output control circuit 24 mainly contains a switch device 241 and a switch control device 243. The switch device 241 is an electronic switch having three terminals. In the present embodiment, its current input terminal is connected to an end of the second output-side electromagnetic coupling element 27, its current output terminal is connected to the negative end of the external power source 29, and its control terminal is connected to the output of the switch control device 243. By the presence and absence of the control voltage provided by the switch control device 243 to its control terminal, the switch device 241 would short-circuit and open-circuit the conduction path between its current input and output terminals accordingly, which in turn determines whether the load circuit is close-circuited or open-circuited. Similarly, the connection of the switch device 241's terminals would vary, depending on the polarity arrangement of the external power source 29 and the configuration of the load 26. The principle lies in that current flows through the current input and output terminals of the switch device 241, and then into the load 26, or current flows into the load 26, and then through the current input and output terminals of the switch device 241.

The operation of the present embodiment is described as follows. First, assuming that the digital control signal issued from the digital system is ON, the switch control device 223 allows the periodical clock signal to apply on the switch device 221. Then, the switch device 221 is thereby short-circuited and open-circuited periodically, causing periodical current to flow from the internal power source 25 to the system-side electromagnetic coupling element 21. Subsequently, due to the electromagnetic coupling effect of the electromagnetic coupling device 20, the periodical current at the system-side electromagnetic coupling element 21 causes the generation of a corresponding periodical voltage across the first output-side electromagnetic coupling element 23. This periodical voltage drives the switch control device 243 to output an appropriate control voltage to the control terminal of the switch device 241, causing the switch device 241 to be short-circuited and thereby forming a complete load circuit. Based on similar operation principles, if the digital control signal issued from the digital system is OFF, the switch device 241 and the load circuit would be open-circuited. The details are omitted for simplicity.

Please note that when the digital control signal is ON and a complete load circuit is formed at the output side, the load current $I_O$ would also flow through the second output-side electromagnetic coupling element 27. Please also note that the system-side switch device 221 is periodically short-circuited and open-circuited under the application of the clock signal. When the system-side switch device 221 is open-circuited, there is no current flowing from the internal power source 25 through the system-side electromagnetic coupling element 21. However, the load current $I_O$ flowing through the second output-side electromagnetic coupling element 27 would induce a corresponding voltage across the system-side electromagnetic coupling element 21 via the electromagnetic coupling effect of the electromagnetic coupling device 20. The digital system therefore could learn the status of the load current $I_O$ by sampling the voltage across the system-side electromagnetic coupling element 21 via the feedback sampling device 225 during the intervals when the system-side switch device 221 is open-circuited by the clock signal. Please note that the output of the switch control device 223 can be additionally connected to the feedback sampling device 225 so that the periodical clock signal can control and feedback sampling device 225 to conduct sampling at appropriate times. In other words, the present embodiment achieves an effective output feedback by a simple second output-side electromagnetic coupling element 27. A side benefit from the second output-side electromagnetic coupling element 27 is that, when the load current $I_O$ is increased, the control voltage driving the switch device 241 would be increased as well, which is an effect equivalent to the reduction of the switch device 241's impedance.

Figure 2B:
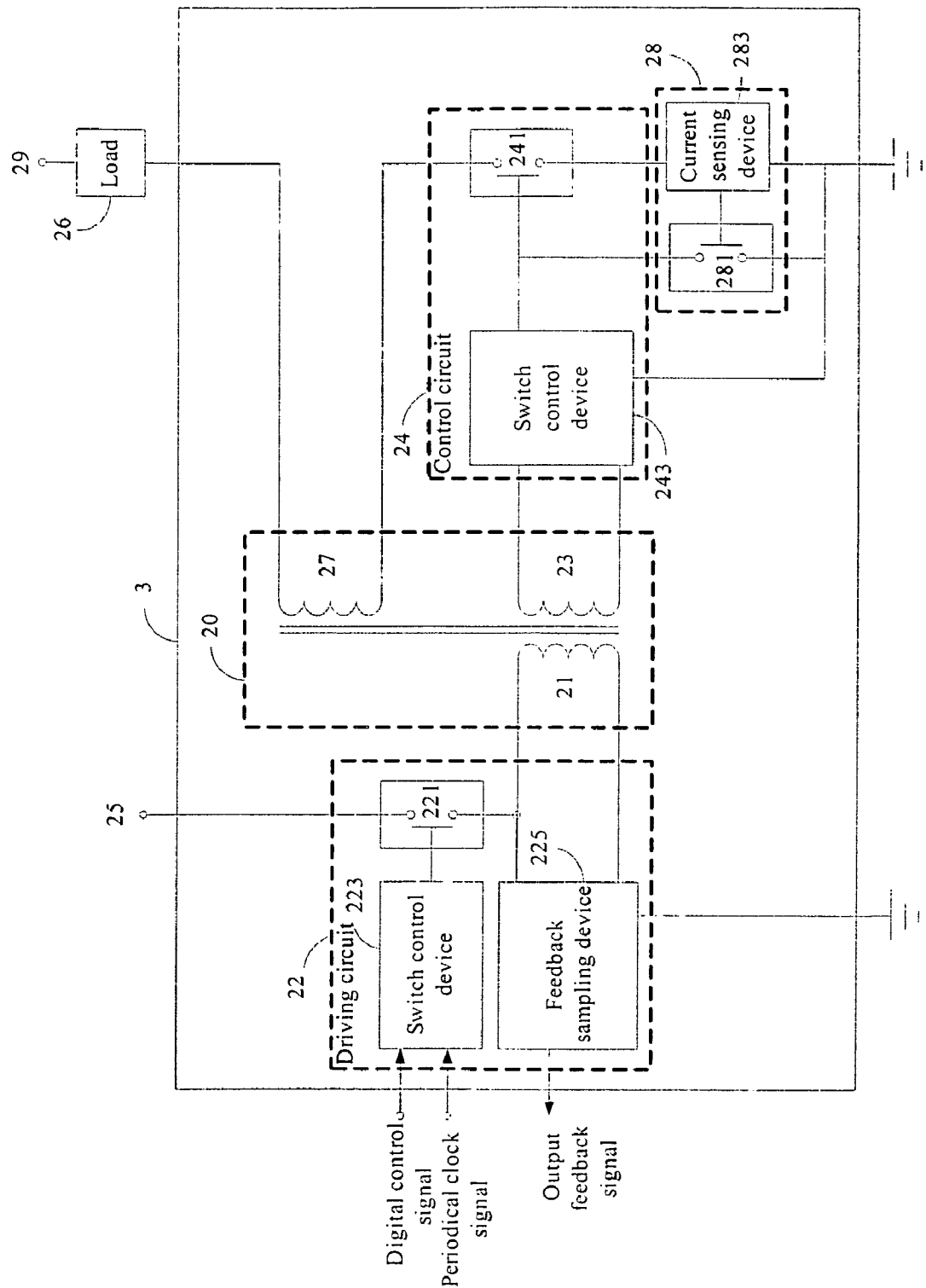
FIG. 2b is a schematic diagram showing a second embodiment of the present invention.

FIG. 2b is a schematic diagram showing a second embodiment of the present invention. As illustrated, the SSR 3 of the present embodiment contains a protection circuit 28 along the load circuit of the previous embodiment, so as to guard against the short circuit of the load circuit and the overloading of the load current $I_0$. The protection circuit 28 contains a current sensing device 283 and a protection device 281. The current sensing device 283 is series connected to the load circuit and delivers an electrical signal corresponding to the load current $I_0$ to the protection device 281, which is an electronic switch having three terminals. In the present embodiment, its current input terminal is connected to the control terminal of the switch device 241, its current output terminal is connected to the negative end of the external power source 29, and its control terminal is connected to the output of the current sensing device 283. When the load circuit is short-circuited or the load current $I_0$ is overloaded, the current sensing device 283 would deliver a corresponding signal to the control terminal of the protection device 281, causing the protection device 281 to be short-circuited. As such, the control voltage supplied by the switch control device 243 is unable to apply to the control terminal of the switch device 241. The switch device 241 and therefore the bad circuit are open-circuited so as to achieve the purpose of protection. Please note that, for ease of description, the present specification describes the protection circuit 28 and the output-side control circuit 24 as two separate circuits. However, in some embodiments, the two circuits could actually be implemented together in a single circuit. Also the load 26 can be at another location as shown in FIG. 2a denoted by the dashed box but, for simplicity, it is not drawn here in FIG. 2b.

Because the foregoing protection action would lead to a drop in the voltage fed back across the two ends of the system-side electromagnetic coupling element 21, the digital system could also detects and learns that whether a protection action has taken place at the output side.

Figure 2C:
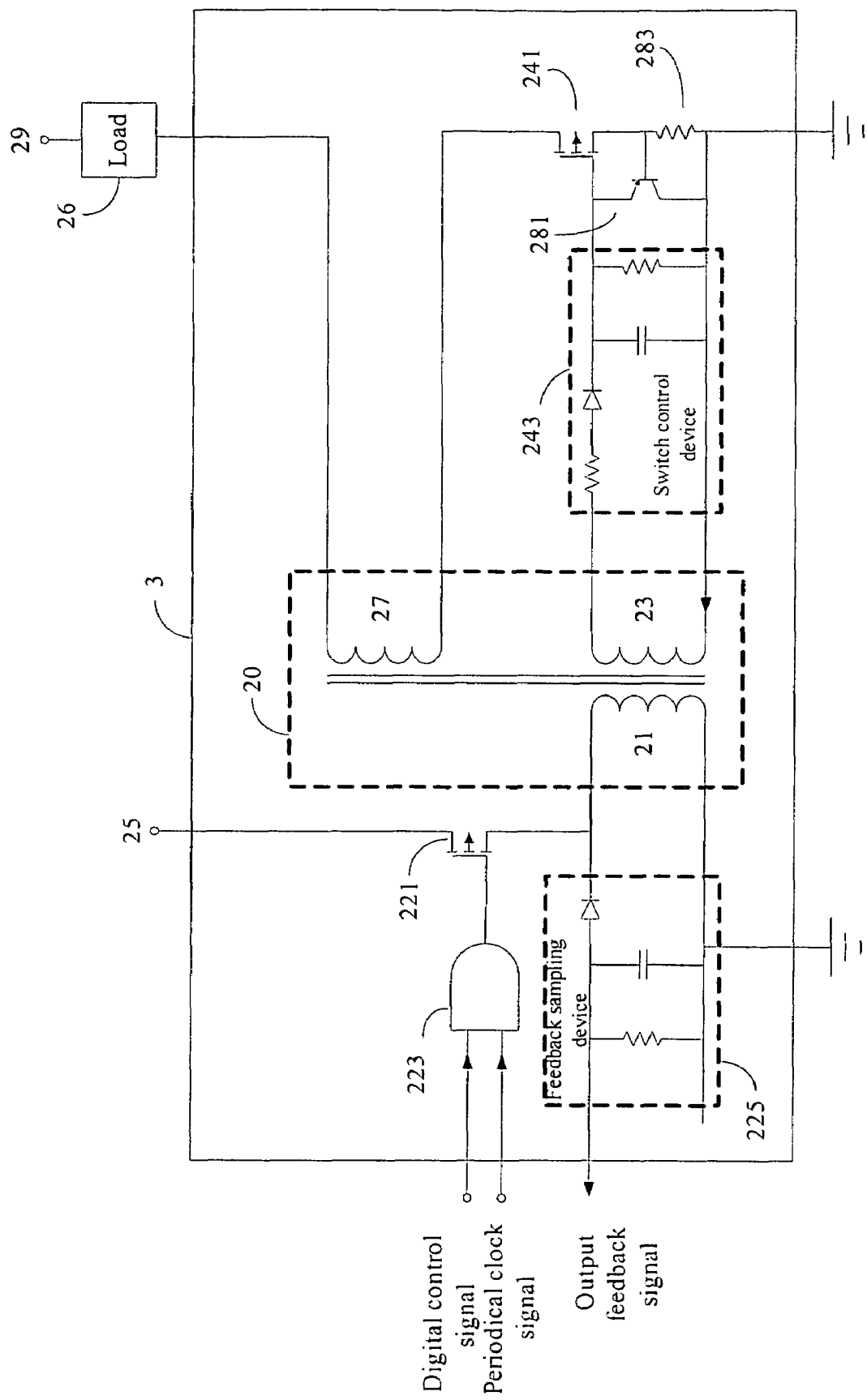
FIG. 2c is a circuit diagram of the second embodiment of FIG. 2b.

To further illustrate how the present invention could be implemented, FIG. 2c is a circuit diagram of the second embodiment of FIG. 2b. As illustrated, the system-side switch device 221 is an electronic switch by a MOSFET transistor. Its source (i.e., the current input terminal) is connected to the positive end of the internal power source 25, its drain (i.e., the current output terminal) is connected to the first end of the system-side electromagnetic coupling element 21, and its gate (i.e., the control terminal) is connected to the output of the switch control device 223. Please note that the implementation of the switch device 221 is not limited to the MOSFET transistor only. On the other hand, the switch control device 223 is a logic circuit mainly containing a dual-input AND gate. Similarly the implementation of the switch control device 223 is not limited to the AND gate only. The feedback sampling device 225 mainly contains a diode, a resistor, and a capacitor, together forming a low pass sample and hold filter.

At the output side, the switch control device 243 mainly contains a diode, a resistor, and a capacitor, together forming an energy converter. During the switch device 221's periodical short circuit and open circuit, the energy induced and stored in the first output-side electromagnetic coupling element 23 by the electromagnetic coupling device 20 would forward-bias the diode and charge the capacitor so that the energy is transferred to the capacitor, which becomes the energy (i.e., the control voltage) to drive the switch device 241 into short circuit. The output-side switch device 241 is also a MOSFET transistor. The current sensing device 283 is a current-to-voltage device, which is a resistor in the present embodiment. The protection device 281 is a bipolar transistor whose collector is the current input terminal, emitter is the current output terminal, and base is the control terminal. In alternative embodiments, other appropriate electronic elements or devices could be used, instead of those specified above. Please note that, in alternative embodiments, the current sensing device 283 could also be a voltage-to-current device in order to drive a current-driven protection device. Also the load 26 can be at another location as shown in FIG. 2a denoted by the dashed box but, for simplicity, it is not drawn here in FIG. 2c.

It should be clear from FIG. 2c that the present invention requires very simple electronic components and circuit structure while achieving the isolation of the system side and the output side, the delivery of the digital control signals, and the feedback of the output side simultaneously, all of which conventionally would require a much more complicated circuit. The operation of FIG. 2c has already been covered when the second embodiment of FIG. 2b is explained and should be clear to those skilled in the related arts.

Figure 2D:
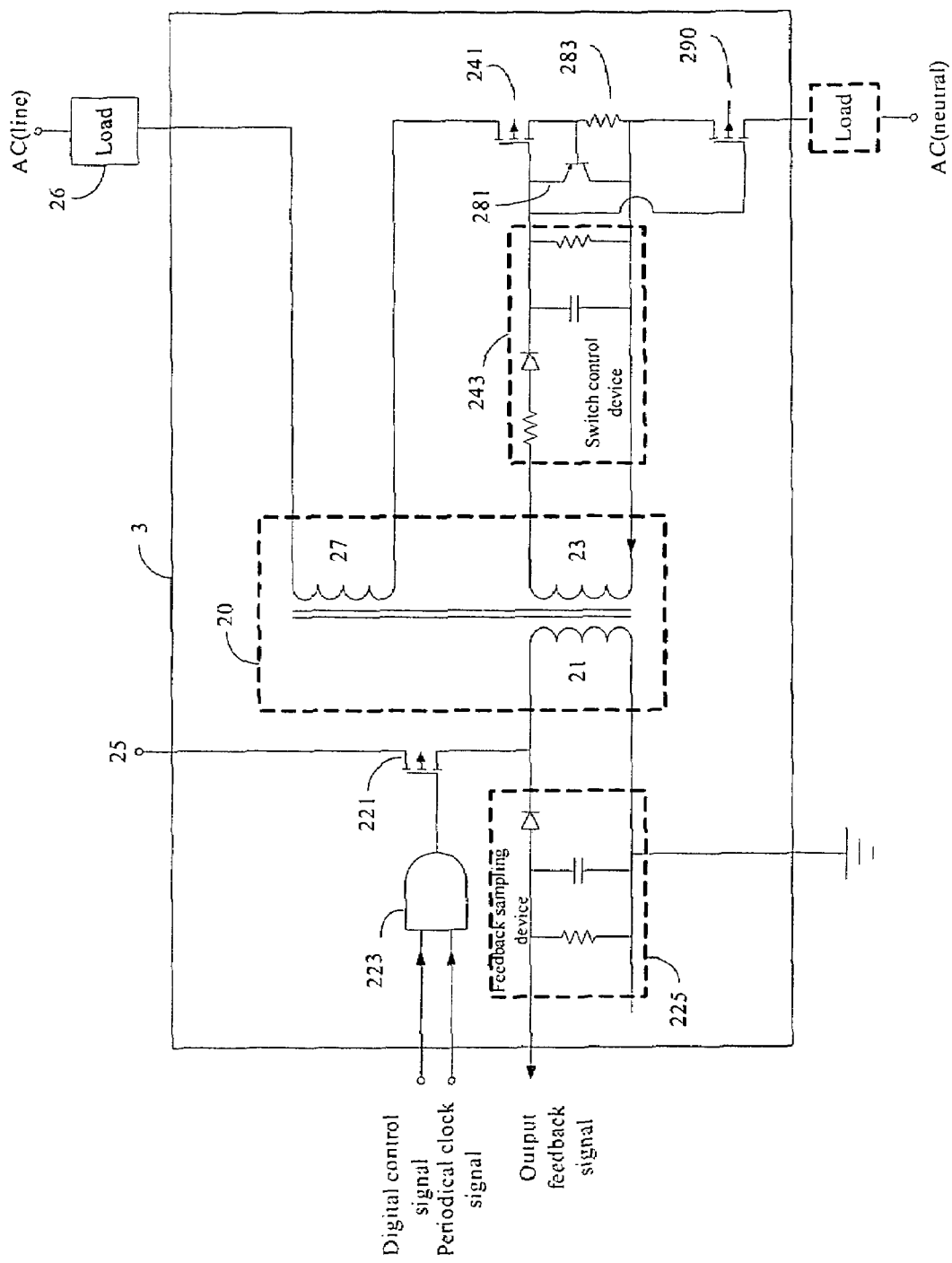
FIG. 2d is another circuit diagram of the second embodiment of FIG. 2b.

In the embodiments and implementations shown in FIGS. 2a, 2b, and 2c, the external power source 29 is assumed to be a DC source. The present invention can also be used in applications where the external power source is an AC source. FIG. 2d is another circuit diagram of the second embodiment of FIG. 2b, where the output side of the present invention is in a series connection with the load 26 between an AC source's line and neutral terminals. Again, the load 26 can also be located at the location denoted by the dashed box. An additional switch device 290 is provided whose operation is exactly like the switch device 241. The switch device 290 can also be a MOSFET transistor.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A solid state relay having a plurality of system-side terminals for connecting to a digital system and a plurality of output-side terminals for connecting to a load and an external power source, said solid state relay comprising:

an electromagnetic coupling device having a system-side electromagnetic coupling element, a first output-side electromagnetic coupling element and a second output-side electromagnetic coupling element, all of which have magnetic flux pass through each other, said system-side electromagnetic coupling element capable of transferring an electrical signal of said system-side electromagnetic coupling element to a correspond electrical signal across said first and second output-side electromagnetic coupling elements, and vice versa;

an output-side control circuit connecting to said first output-side electromagnetic coupling element in a parallel connection and to said second output-side electromagnetic coupling element in a series connection, said output-side control circuit and said second output-side electromagnetic coupling element in turn, via said output-side terminals, connecting to said load in a series connection and jointly forming a load circuit to said external power source; and a system-side driving circuit positioned between said system-side terminals and said system-side electromagnetic coupling element, said system-side driving circuit being powered by an internal power source of said digital system and receiving a digital control signal from said digital system, said system-side driving circuit providing a feedback signal corresponding to an electrical status of said load circuit to said digital system, said system-side driving circuit connecting to said system-side electromagnetic coupling element in a parallel connection;

wherein, when said digital system outputs an ON digital control signal, said system-side driving circuit periodically applies said internal power source to said system-side electromagnetic coupling element, said first output-side electromagnetic coupling element is thereby induced to generate a corresponding electrical signal, and said electrical signal drives said output-side control circuit to turn said load circuit into a closed circuit;

when said digital system outputs an OFF digital control signal, said system-side driving circuit separates said internal power source and said system-side electromagnetic coupling element, said first output-side electromagnetic coupling element thereby cannot generates an electrical signal to turn said load circuit into a closed circuit, said load circuit thereby is therefore open-circuited; and during when said digital system outputs an ON digital control signal and during the periods when said internal power source is not applied to said system-side electromagnetic coupling element, said feedback signal is produced by said system-side driving circuit by sampling an electrical signal across said system-side electromagnetic coupling element induced by said electrical status of said load circuit via said second output-side electromagnetic coupling element.

2. The solid state relay according to claim 1, wherein said system-side driving circuit comprises:
  a switch device, said switch device and said system-side electromagnetic coupling element series-connected to said internal power source;
  a switch control device, said switch control device accepting said digital control signal from said digital system and a clock signal to periodically control the conduction of said switch device; and
  a feedback sampling device connected to said system-side electromagnetic coupling element in parallel, said feedback sampling device producing said feedback signal by sampling said system-side electromagnetic coupling element at appropriate times.

3. The solid state relay according to claim 2, wherein said switch device is an electronic switch having a current input terminal, a current output terminal, and a control terminal determining the conduction between said current input and output terminals; said current input and output terminals and said system-side electromagnetic coupling element are series-connected to said internal power source; and said control terminal is connected to the output of said switch control device.

4. The solid state relay according to claim 2, wherein said switch control device is a logic circuit accepting said digital control signal from said digital system and said clock signal as input and whose output is connected to said switch device; and said logic circuit is controlled by said digital control signal to determine the application of said clock signal on said switch device.

5. The solid state relay according to claim 4, wherein the output of said switch control device is connected to said feedback sampling device so that said clock signal control said feedback sampling device to sample at appropriate times.

6. The solid state relay according to claim 2, wherein said feedback sampling device is a low-pass sample and hold filter.

7. The solid state relay according to claim 1, wherein said clock signal is provided by said digital system via one of said system-side terminals.

8. The solid state relay according to claim 1, wherein said clock signal is provided by an oscillator of said system-side driving circuit.

9. The solid state relay according to claim 1, wherein said output-side control circuit comprises:
  a switch device, said switch device and said second output-side electromagnetic coupling element and said load series-connected to said external power source to form said load circuit; and
  a switch control device connected to said first output-side electromagnetic coupling element in parallel, said switch control being device driven by an electrical signal induced across said first output-side electromagnetic coupling element to control the conduction of said switch device.

10. The solid state relay according to claim 9, wherein said switch device is an electronic switch having a current input terminal, a current output terminal, and a control terminal determining the conduction between said current input and output terminals; said current input and output terminals, said second output-side electromagnetic coupling element, and said load are series-connected to said external power source; and said control terminal is connected to the output of said switch control device.

11. The solid state relay according to claim 9, wherein said switch control device is an energy conversion circuit storing an energy induced across said first output-side electromagnetic coupling element as an energy required for the conduction of said switch device.

12. The solid state relay according to claim 9, further comprising:
  a current sensing device series-connected to said load circuit, said current sensing device delivering an electrical signal corresponding to the current of said load circuit; and
  a protection device, said protection device taking said electrical signal from said current sensing device as input, said protection device connected to said switch control device in parallel so as to control whether a control signal output by said switch control device reaches said switch device.

13. The solid state relay according to claim 12, wherein said current sensing device is a current-to-voltage or a voltage-to-current device.

14. The solid state relay according to claim 12, wherein said protection device is an electronic switch having a current input terminal, a current output terminal, and a control terminal determining the conduction between said current input and output terminals; said current input and output terminals are connected to said switch control device in parallel; said control terminal is connected to the output of said current sensing device so as to control whether said control signal output by said switch control device reaches said switch device.

* * * * *